United States Patent
Sasano

(10) Patent No.: US 6,531,334 B2
(45) Date of Patent: Mar. 11, 2003

(54) METHOD FOR FABRICATING HOLLOW PACKAGE WITH A SOLID-STATE IMAGE DEVICE

(75) Inventor: Keiji Sasano, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/985,392

(22) Filed: Nov. 2, 2001

(65) Prior Publication Data

US 2002/0024131 A1 Feb. 28, 2002

Related U.S. Application Data

(62) Division of application No. 09/112,229, filed on Jul. 9, 1998, now Pat. No. 6,313,525.

(30) Foreign Application Priority Data

Jul. 10, 1997 (JP) .............................................. 09-185061

(51) Int. Cl.⁷ .......................... H01L 21/00; H01R 43/00
(52) U.S. Cl. .......................... 438/64; 438/107; 438/111; 438/123; 438/125; 29/827; 29/832; 29/837
(58) Field of Search ................................ 257/431, 432, 257/433, 444, 678, 680, 666, 690, 692, 693, 696, 702, 704, 784; 438/106, 107, 110, 111, 116, 125, 48, 51, 57, 60, 64, 75, 123; 29/827, 832, 837

(56) References Cited

U.S. PATENT DOCUMENTS

| 4,379,039 A | 4/1983 | Fujimoto et al. ....... 204/159.15 |
| 4,442,456 A | 4/1984 | Iwata et al. .................... 301/56 |
| 4,537,863 A | 8/1985 | Matsuura et al. ............. 501/15 |
| 4,572,924 A | 2/1986 | Wakely et al. ............. 174/52.4 |
| 4,594,613 A | 6/1986 | Shinbori et al. ............ 358/213 |
| 4,745,470 A | 5/1988 | Yabe et al. ..................... 358/98 |
| 4,761,518 A | 8/1988 | Butt et al. ................. 174/52.4 |
| 4,921,748 A | 5/1990 | Bohrn et al. ................ 428/209 |
| 5,122,862 A | 6/1992 | Kajihara et al. ............ 257/704 |
| 5,278,429 A | 1/1994 | Takenaka et al. ........... 257/678 |
| 5,343,076 A * | 8/1994 | Katayama et al. .......... 257/717 |
| 5,436,492 A | 7/1995 | Yamanaka .................. 257/433 |
| 5,523,608 A | 6/1996 | Kitaoka et al. ............. 257/433 |
| 5,529,959 A * | 6/1996 | Yamanaka .................. 438/64 |
| 5,757,075 A | 5/1998 | Kitaoka ....................... 257/712 |
| 5,796,714 A | 8/1998 | Chino et al. .................. 372/50 |
| 6,093,576 A * | 7/2000 | Otani ............................. 438/5 |
| 6,313,525 B1 * | 11/2001 | Sasano ....................... 257/704 |

FOREIGN PATENT DOCUMENTS

| EP | 434392 | | 6/1991 |
| JP | 56-069842 | | 6/1981 |
| JP | 56-116649 | * | 9/1981 |
| JP | 58-108282 | | 6/1983 |
| JP | 61-194751 | | 8/1986 |
| JP | 62-045154 | | 2/1987 |
| JP | 62-285456 | | 12/1987 |

* cited by examiner

Primary Examiner—David L. Talbott
Assistant Examiner—Alonzo Chambliss
(74) Attorney, Agent, or Firm—Rader, Fishman, & Grauer PLLC; Ronald P. Kananen, Esq.

(57) ABSTRACT

A hollow package includes a package body composed of an epoxy resin having a low thermal coefficient of linear expansion, wherein the package body includes a recess for receiving an electronic component, and leads, for extracting electrodes of the electronic component, extending from the inner surface of the recess, via the upper surface of the package body, to the peripheral surface, and a transparent sealing plate bonded onto the upper surface of the package body with an ultraviolet-curable resin.

2 Claims, 3 Drawing Sheets

FIG. 1
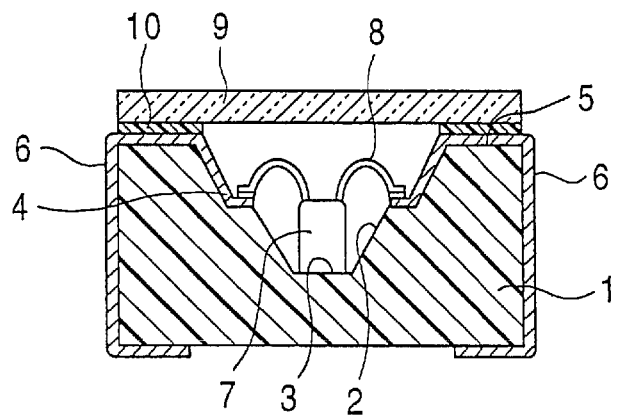
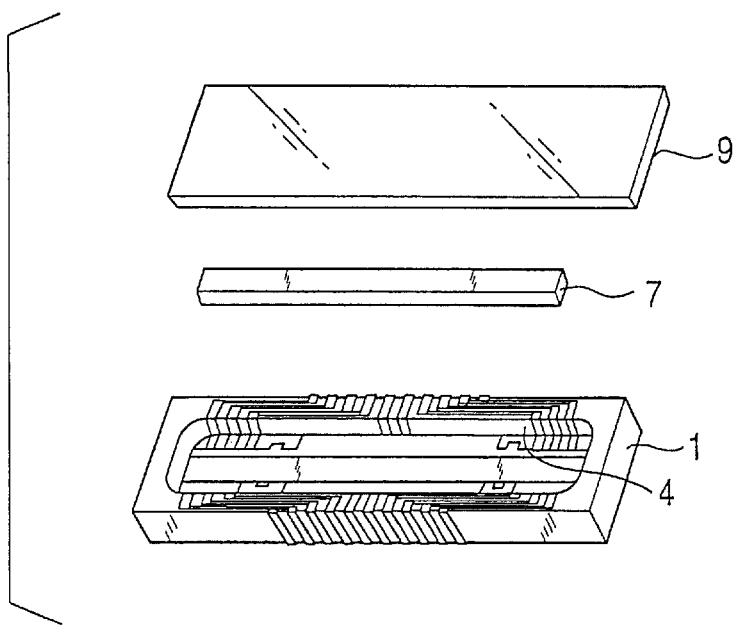
FIG. 2A
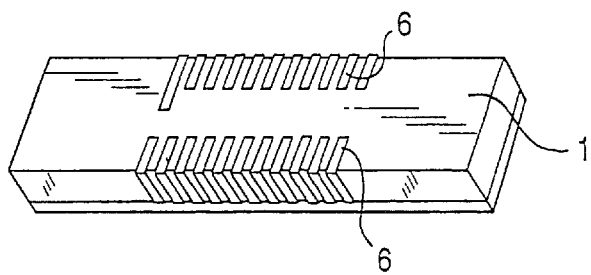
FIG. 2B

METHOD FOR FABRICATING HOLLOW PACKAGE WITH A SOLID-STATE IMAGE DEVICE

CROSS-REFERENCE TO RELATED APPLICATIONS

This applications a divisional of application Ser. No. 09/112,229, field Jul. 9,1998, now U.S. Pat. No. 6,313,525.

BACKGROUND OF THE INVENTION

1. Field of the Invention

The present invention relates to a hollow package, particularly a hollow package in which a package body having a recess is sealed with a transparent sealing plate, and also relates to a method for fabricating the same.

2. Description of the Related Art

A solid-state image apparatus of a typical leadless chip carrier (LCC) generally has a structure, as shown in FIG. 4, in which a ceramic package body having a recess with a step receives a solid-state image device, and the package body is sealed with a glass plate. In the drawing, symbol a represents a first layer of the ceramic package, which is flat, and a metallized lead d is formed thereon, extending from the side to the outer bottom. Symbol b represents a second layer of the ceramic package, which is in the shape of a rectangular frame, and a metallized lead d is formed thereon, extending from the upper surface to the side, and also connecting to the lead d on the first layer a. Symbol c represents a third layer of the ceramic package, which is in the shape of a rectangular frame, and an opening of the third layer c is larger than an opening of the second layer b. The two openings form a recess e, for receiving a solid-state image device, having a step with the first layer a serving as the inner bottom.

Symbol f represents a solid-state image device received in recess e on the ceramic package, symbol g represents bonding wires connecting between electrodes of the solid-state image device e and the metallized leads g and symbol h represents a transparent sealing plate composed of glass bonded onto the upper surface of the package with an adhesive i therebetween for sealing the recess e.

Next, a method for fabricating the package will be described. Unsintered package sheets a, b, and c (corresponding to the first layer a, second layer b, and third layer c), which are so-called "green sheets" or "green ceramic sheets", are prepared. The green lead d is formed on the individual sheets a and b. The individual sheets, a, b and c are deposited at predetermined positions and are sintered, whereby the package is obtained. Next, the metallized lead d is formed by plating, and die bonding is performed to the solid-state image device f, followed by wire bonding. Lastly the transparent sealing plate h composed of glass is bonded onto the upper surface of the package body. Thus, a solid-state image apparatus is complete, in which the solid-state image device is received in the ceramic hollow package.

Because of the high cost of materials and processing for ceramic hollow packages, it has been difficult to reduce the fabrication costs of solid-state image apparatuses. Therefore, the present inventor and others have made attempts to fabricate hollow packages from a resin instead of ceramic by applying the molded interconnect device (MID) technique widely used in various electronic devices to hollow packages. This is because an MID is an electronic component in which a circuit (three-dimensional circuit) is formed on a three-dimensional part produced by injection molding, and a resin material which is considerably less expensive in comparison with a ceramic material is used, and also the inexpensive injection molding technique which is easier and faster than sintering is used for formation. In particular, it is greatly advantageous that injection molding be performed once to enable the formation of a package body even in the case of a three-dimensional part, which is in contrast to the complex fabrication of a ceramic hollow package requiring the steps of forming three-layers of green sheets, depositing them at correct positions, and sintering.

The current MID technique, however, has been found to be unsuitable for hollow packages which receive semiconductor devices such as solid-state image devices. The reason is that the general MID, a thermoplastic resin having a high thermal coefficient of linear expansion, for example, a liquid crystal polymer (LCP) or PPS, is used, and there is a large difference in thermal coefficient of linear expansion between the thermoplastic resin and glass used as the transparent sealing plate. Therefore, if the hollow package is sealed with the transparent sealing plate, either the sealing plate or the resin forming the package body will be easily cracked, resulting in difficulty in maintaining air-tightness.

Also, since leads, i.e., lands, and areas between leads, i.e., spaces, intervene between the transparent sealing plate and the package body which are to be bonded together, if the general adhesion technique using a thermosetting resin is employed, an internal pressure between the package body and the transparent sealing plate increases because of the heating for adhesion, resulting in air leakage through the spaces of the lands-and-spaces. This also does not allow air-tightness to be maintained.

In the case of a ceramic hollow package, since a plurality of sheets having a lead on the surface are deposited, a lead for connecting between the interior of the hollow package and the exterior can be formed even without placing wires on the upper surface of the hollow package. On the other hand, in the case of a package body formed by using the MID technique, unless a through-hole is formed on the package body, and the interior of the package body and the external lead are connected via the through-hole, the lead must be formed on the surface of the package body, and thus, the lead inevitably runs on the upper surface of the package body which is the connecting section between the package body and the transparent sealing plate. As a result, the lands-and-spaces are formed on the upper surface of the package. The thickness of the spaces is substantially equal to the thickness of the lead, for example, 20 to 30 $\mu$m. Generally, since a thermosetting resin is used as the adhesive, if the conventional technique is followed, heat treatment must be performed to generate adhesive bonding in the adhesive material. If heat treatment is performed, the internal pressure within the hollow package increases inevitably and even if a resin for adhesion is buried in the spaces, air leakage occurs, and thus, it is impossible or extremely difficult to maintain air-tightness.

SUMMARY OF THE INVENTION

As described above, it seemed impossible to apply the MID technique to a hollow package, in which a semiconductor device such as a solid-state image device placed in a package body is sealed with a transparent sealing plate, for example, glass. However, the present inventor continued to investigate in order to overcome the difficulty, and finally achieved the present invention.

It is an object of this invention to provide a method for fabricating a hollow package with a resin, in which an electronic component, for example, a semiconductor device, placed in a recess on a package body is sealed with a transparent sealing plate, such that the cost of materials and processing is reduced and the price of an electronic apparatus (for example, a solid-state image apparatus) provided with the hollow package is reduced.

In accordance with one aspect of the present invention, a hollow package includes a package body having an MID structure composed of an epoxy resin having a low thermal coefficient of linear expansion and a transparent sealing plate which is bonded onto the upper surface of the package body with an ultraviolet-curable resin. The package body includes leads, for extracting electrodes of a contained electronic component, which extend from the inner surface of a recess, via the upper surface of the package body, to the peripheral surface. The transparent sealing plate protects the recess on the package body from the exterior.

In accordance with the hollow package of the present invention, firstly, since the epoxy resin having a low thermal coefficient of linear expansion is used as a material to form the package body, the difference in thermal coefficient of linear expansion between the transparent sealing plate and the package body can be minimized, and even if the interior of the hollow package is sealed with the transparent sealing plate, the transparent sealing plate or the resin forming the package body is not easily cracked by thermal stress, enabling air-tightness to be maintained.

Secondly, since the ultraviolet-curable resin is used as the adhesive for bonding the package body and the transparent sealing plate together, no heating is required in order to generate adhesive bonding. Accordingly, it is possible to maintain air-tightness since there is no heating which may increase the internal pressure between the package body and the transparent sealing plate and thus may cause air leakage through the spaces in the lands-and-spaces described above.

Thirdly, since the package body is composed of a resin which is less expensive in comparison with ceramic, the cost of materials can be reduced, and also since the package body is formed by infection molding which does not require the deposition of green sheets or sintering, the cost of formation can also be reduced. Accordingly, the price of an electronic apparatus provided with the hollow package can be reduced.

In accordance with another aspect of the present invention, a method for fabricating a hollow package includes the steps of forming a package body by three-dimensional injection molding of an epoxy resin having a low thermal coefficient of linear expansion; roughening a surface of the package body; forming a wiring layer by electroless plating; forming leads by patterning the wiring layer; receiving an electronic component into a recess of the package body and connecting electrodes of the electronic component to the leads; and then bonding a transparent sealing plate onto an upper surface of the package body with an ultraviolet-curable resin.

In accordance with the method for fabricating the hollow package, since the package body is composed of a resin which is less expensive in comparison with ceramic, the cost of materials can be reduced, and also since the package body is formed by injection molding which does not require the deposition of green sheets or sintering, the cost of formation can also be reduced. Accordingly, the price of an electronic apparatus provided with the hollow package can be reduced.

Since the surface of the package body is roughened after the formation, adhesiveness of the wiring layer subsequently formed can be increased, and the bond strength of the transparent sealing plate to be bonded to the hollow package can be increased. Also, because of the roughening, connectivity between the leads and, connectors, for example, connecting wires, can be strengthened.

In accordance with still another aspect of the present invention, a solid-state image apparatus includes a package body composed of an epoxy resin having a low thermal coefficient of linear expansion and a transparent plate bonded onto the upper surface of the package body. The package body includes a recess for receiving a solid-state image device, and leads, which are connected to electrodes of the solid-state image device, extending from the inner surface of the recess, via the upper surface of the package body, to the peripheral surface.

BRIEF DESCRIPTION OF THE DRAWINGS

FIG. 1 is a sectional view showing a hollow package as a first embodiment of the present invention;

FIG. 2A is an assembly view the first embodiment shown in FIG. 1, and FIG. 2B is a perspective view showing a bottom surface of the first embodiment;

DESCRIPTION OF THE PREFERRED EMBODIMENT

Figure 3A:
FIGS. 3A through 3I are sectional views which show step by step an example of a method for fabricating the hollow package shown in FIGS. 1, 2A and 2B (i.e., a method of fabricating a hollow package as a first embodiment of the present invention)

A hollow package in accordance with the present invention includes a package body having an MID structure composed of an epoxy resin having a low thermal coefficient of linear expansion, wherein the package body includes a recess for receiving an electronic component, and the leads for extracting electrodes of the electronic component, and the leads extend from the inner surface of the recess, via the upper surface, tot he peripheral surface. The hollow package also includes a transparent sealing plate for protecting the recess of the package body from the exterior, wherein the sealing plate is bonded onto the upper surface of the package body with an ultraviolet-curable resin. A suitable example of the electronic component is a semiconductor device such as a solid-state image device, which is used as an area sensor or a line sensor; however, the electronic component is not limited to the above. For example, a light-emitting device may be used. A typical recess includes an inner bottom to which a semiconductor device is bonded and a step having a bonding area which lies outside the inner bottom and one step higher up, however, the recess is not limited to this, and the number of steps may be greater. The leads may be composed of any metal as long as it can be applied onto the resin surface forming the package body by electroless plating, or it can be applied to the electroless-plated underlying layer by electroless plating or electroplating, and has proper conductivity. Also, the leads may be single-layered or multi-layered. Specifically, the leads may be multi-layered, composed of gold or the like.

Preferably, the thermal coefficient of linear expansion of the epoxy resin having a low thermal coefficient of linear expansion is 13 ppm or less. The reason is that this is relatively close to the thermal coefficient of linear expansion of glass, i.e., 5 to 7 ppm, which has significantly high transparency and is most commonly used for optical purposes, and cracks do not easily occur by thermal stress in the transparent sealing plate or the package body, and in the electronic component in the package body. By three-dimensional injection molding of the epoxy resin, the package body for the hollow package is formed.

A method for fabricating a hollow package in accordance with the present invention includes the steps of forming a package body having a recess by three-dimensional injection molding of an epoxy resin having a low thermal coefficient of linear expansion; roughening the entire surface of the package body; forming a wiring layer entirely onto the surface of the package body by electroless plating; forming leads by patterning the wiring layer by means of exposure using a resist, development, and selective etching; receiving an electronic component into the recess and connecting electrodes of the electronic component to the leads; and then, bonding a transparent sealing plate onto the upper surface of the package body with an ultraviolet-curable curable resin. The roughening of the surface of the package body may be performed, for example, by immersing the package body in a liquid that erodes the resin for an appropriate period of time, or may be performed by physical means or any other means.

The present invention will be described in detail with reference to embodiments shown in the drawings. FIG. 1 is a sectional view showing a hollow package as a first embodiment of the present invention, and FIG. 2A is an assembly view of the same. In the drawings, numeral 1 represents a package body composed of an epoxy resin having a low thermal coefficient of linear expansion formed by an MID technique, that is, by three-dimensional injection molding. The thermal coefficient of linear expansion of the epoxy resin is, for example, 13 ppm or less. Numeral 2 represents a recess of the package body 1, numeral 3 represents the inner bottom of the recess as a solid-state image device bonding area, and numeral 4 represents a step of the recess 2. Numeral 5 represents the upper surface of the package body, and a portion between the upper surface 5 and the step 4, that is, an upper inner side, and a portion between the step 4 and the inner bottom 3, that is, a lower inner side, are both inclined planes, with an inclination of, for example, approximately 30 degrees in relation to the vertical. The inner sides are inclined so that there is no shade other than a photomask caused by exposure light when exposure is performed in order to pattern the leads.

Numeral 6 represents leads formed on the surface of the package body, which are formed, for example, by plating nickel (with a thickness of, for example, 3 $\mu$m) onto the surface of copper (with a thickness of, for example, 10 $\mu$m), and by further plating gold (with a thickness of, for example, 0.3 $\mu$m) onto the surface of the nickel-plated layer.

The individual leads 6 extend from the bottom of the hollow package 1, the outer surface, the upper surface 5, the upper inner side, to the step 4. The ends of the individual leads 6 lying on the step 4 are connected to the ends of a connecting wires 8 which are described below.

Numeral 7 represents a solid-state image device, for example, for a line sensor, mounted on the inner bottom of the package body 1 by die bonding. Numeral 8 represents connecting wires for connecting between electrodes of the solid-state image device 7 and the ends of the leads 6, which are composed of, for example, gold or aluminum. Numeral 9 represents a transparent sealing plate composed of glass, which is bonded onto the upper surface of the package body 1 with an adhesive 10 composed of an ultraviolet-curable resin. FIG. 2B is a perspective view showing a bottom surface of the package body 1 of the embodiment.

In accordance with the hollow package of the present invention, firstly, since the epoxy resin having a low thermal coefficient of linear expansion is used as the package body 1, the difference in thermal coefficient of linear expansion between the transparent sealing plate 9 and the package body 1 can be minimized, and even if the interior of the hollow package is a sealed with the transparent sealing plate 9, the transparent sealing plate 9 or the resin forming package body 1 is not easily cracked by thermal stress, enabling air-tightness to be maintained.

Secondly, since the ultraviolet-curable resin 10 is used as the adhesive for bonding the transparent sealing plate 9 composed of glass onto the upper surface 5 of the package body 1, ultraviolet rays are radiated in order to generate adhesive bonding, and heating is not required. Accordingly, it is possible to maintain air-tightness since there is no heating which may increase the internal pressure between the package body and the transparent sealing plate and thus may cause air leakage through the spaces in the lands-and-spaces of the leads 6.

Thirdly, since the package body is composed of a resin which is less expensive in comparison with ceramic, the cost of materials can be reduced, and also since the package body is formed by injection molding which does not require either the deposition of green sheets or sintering, the cost of formation can also be reduced. Accordingly, the price of a device, for example, a line sensor, provided with the hollow package can be reduced.

FIGS. 3A through 3I are sectional views which show the main process of fabricating the hollow package shown in FIG. 1.

(A) As shown in FIG. 3A, a package body 1 is prepared. A plurality of package bodies 1 for a plurality of line sensors are fabricated in one piece. The adjacent package bodies 1 and 1 adjoin each other at the outer sides. A portion to be a line of the lead 6 corresponds to a through-hole 11, and a portion to be a space corresponds to a space between the adjacent through-holes 11 and 11, which connects the package bodies 1 and 1. At the final stage, the resin is cut along the line passing through the through-hole 11 to separate the adjacent package bodies 1 and 1.

Figure 3B:
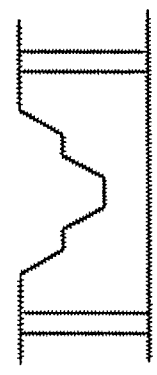

(B) Next, the package body 1 is immersed in an eroding liquid, for example, a chlorine-based etching liquid, in order to roughen the entire surface of the package body 1, as shown in FIG. 3B, and then,a catalyst is applied onto the surface to assist plating.

Figure 3C:
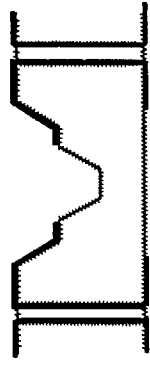

(C) Next, as shown in FIG. 3C, a wiring layer (with a thickness of, for example, 10 $\mu$m) 6 composed of copper is formed by plating. Since this plated layer is formed onto the surface of the package body 1 that is an insulator, electroless plating is performed.

Figure 3D:
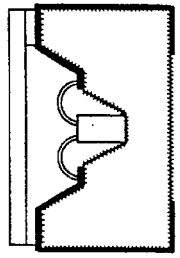

(D) Next, a positive resist 12 is applied onto the surface of the lead 6, and the resist 12 is patterned by exposure and development treatments, as shown in FIG. 3D.

Figure 3E:
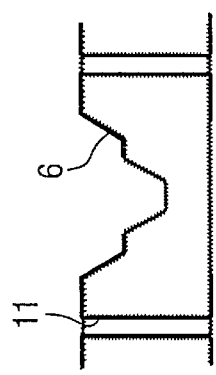

(E) Next, with the patterned resist 12 as a mask, etching is performed onto the wiring layer 6 composed of copper to produce the lead 6. Then, the resist 12 used as the mask is removed. FIG. 3E shows a state in which the resist has been removed.

Figure 3F:
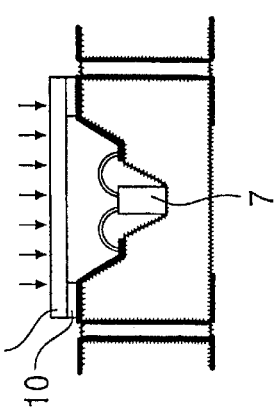

(F) Next, as shown in FIG. 3F, nickel is plated (with a thickness of, for example, 3 $\mu$m) onto the lead 6, and further, gold is plated (with a thickness of, for example, 0.3 $\mu$m).

Figure 3G:
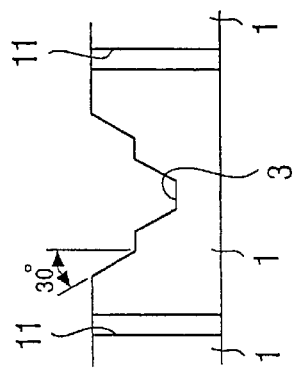

(G) Next, a solid-state image device 7 is mounted on the inner bottom 3 of the package body 1, and then, wire (8) bonding is performed. FIG. 3G shows a state in which wire bonding has been performed.

Figure 3H:
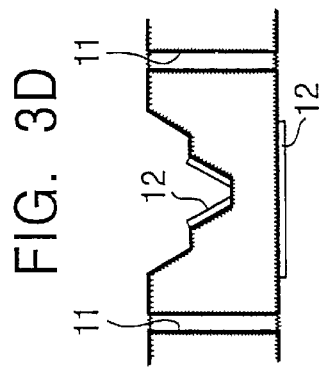

(H) Next, an ultraviolet-curable resin 10 is applied onto the upper surface 5 of each package body 1, a transparent sealing plate 9 composed of glass is placed onto the upper surface 5 of each package body 1, and then, as shown in FIG. 3H, the ultraviolet-curable resin 10 is irradiated with ultraviolet rays through the transparent sealing plate 9 so that the package body 1 and the ultraviolet-curable resin 10 are bonded together.

Figure 3I:
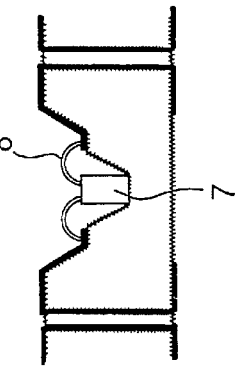
Figure 4:
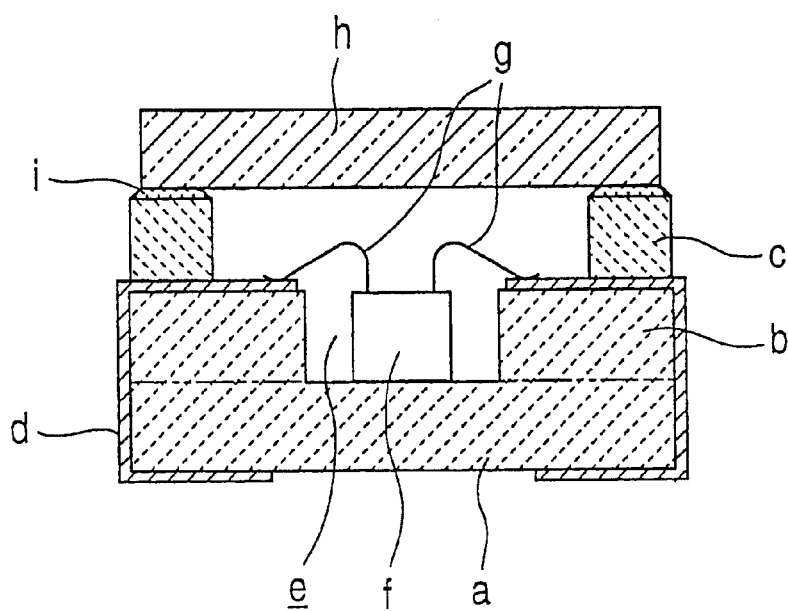
FIG. 4 is a sectional view of a conventional hollow package.

(I) Next, by cutting apart the package bodies 1 and 1, individual linear sensors are separated. FIG. 3I shows an independent linear sensor.

In accordance with the method for fabricating the hollow package of the present invention, since the package body 1 is composed of a resin which is less expensive in comparison with ceramic, the cost of materials can be reduced, and also since the package body is formed by injection molding which does not require either the deposition of green sheets or sintering, the cost of formation can also be reduced. Accordingly, the price of an apparatus, for example, a linear sensor, provided with the hollow package can be reduced.

Also, since the surface of the package body 1 is roughened after the formation, adhesiveness of the wiring layer 6 subsequently formed can be increased, and the bond strength of the transparent sealing plate 9 to be bonded to the package body 1 can be increased. Also, because of the roughening, connectivity between the leads 6 and the connecting wires 8 to be connected can be strengthened.

In accordance with the hollow package of the present invention, firstly, since the epoxy resin having a low thermal coefficient of linear expansion is used as the adhesive for bonding the package body and the transparent sealing plate together, the difference in thermal coefficient of lineal expansion between the transparent sealing plate and the package body can be minimized, and even if the interior of the hollow package is sealed with the transparent sealing plate, the transparent sealing plate or the resin forming the package body is not easily cracked by thermal stress, enabling air tightness to be maintained.

Secondly, since the ultraviolet-curable resin is used as the adhesive for bonding the transparent sealing plate and the package body together, heating is not required in order to generate adhesive bonding. Accordingly, it is possible to maintain air-tightness since there is no heating which may increase the internal pressure between the package body and the transparent sealing plate and thus may cause air leakage through the spaces of the lands-and-spaces of the leads running on the upper surface of the package body.

Thirdly, since the package body is composed of a resin which is less expensive in comparison with ceramic, the cost of materials can be reduced, and also since the package body is formed by injection molding which does not require either the deposition of green sheets or sintering, the cost of formation can also be reduced. Accordingly, the price of an electronic apparatus provided with the hollow package can be reduced.

In accordance with the method for fabricating the hollow package of the present invention, since the package body is composed of a resin which is less expensive in comparison with a ceramic, the cost of materials can be reduced, and also since the package body is formed by injection molding which does not require the deposition of green sheets or sintering, the cost of formation can also be reduced. Accordingly, the price of an electronic apparatus provided with the hollow package can be reduced.

Also, since the surface of the package body is roughened after the formation, adhesiveness of the wiring layer subsequently formed can be increased, and the bond strength of the transparent sealing plate to be bonded to the package body can be increased. Also, because of the roughening, connectivity between the wiring layer and the connecting wires to be connected can be strengthened.

What is claimed is:

1. A method for fabricating a hollow package, comprising the steps of:

forming a package body having a recess by three-dimensional injection molding of an epoxy resin having a lower thermal coefficient of linear expansion than that of a transparent sealing plate;

roughening the entire surface of said package body;

forming a wiring layer substantially onto the entire surface of said package body by electroless plating;

forming leads by patterning said wiring layer by means of selective etching;

receiving a solid state image device into said recess and connecting electrodes of said solid state image device to said leads; and bonding said transparent sealing plate onto an upper surface of said package body with an ultraviolet-curable resin.

2. A method for fabricating a hollow package according to claim 1, wherein said low thermal coefficient of linear expansion is 13 ppm or less.

* * * * *